United States Patent
Weng et al.

(10) Patent No.: US 10,332,942 B2
(45) Date of Patent: Jun. 25, 2019

(54) OLED TOUCH DISPLAY PANEL

(71) Applicant: HON HAI PRECISION INDUSTRY CO., LTD., New Taipei (TW)

(72) Inventors: Yu-Fu Weng, New Taipei (TW); Chien-Wen Lin, New Taipei (TW); Chia-Lin Liu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 21 days.

(21) Appl. No.: 15/656,127

(22) Filed: Jul. 21, 2017

(65) Prior Publication Data

US 2018/0047794 A1    Feb. 15, 2018

Related U.S. Application Data

(60) Provisional application No. 62/374,081, filed on Aug. 12, 2016.

(51) Int. Cl.
| | |
|---|---|
| *H01L 27/32* | (2006.01) |
| *H01L 51/52* | (2006.01) |
| *G06F 3/044* | (2006.01) |
| *G06F 3/041* | (2006.01) |

(52) U.S. Cl.
CPC ............ *H01L 27/323* (2013.01); *G06F 3/044* (2013.01); *G06F 3/0412* (2013.01); *G06F 3/0414* (2013.01); *H01L 51/5221* (2013.01); *H01L 51/5228* (2013.01); *G06F 2203/04103* (2013.01); *G06F 2203/04108* (2013.01); *H01L 27/3244* (2013.01)

(58) Field of Classification Search
CPC ............... H01L 27/323; H01L 27/3244; H01L 51/5228; G06F 3/0414; G06F 3/044
See application file for complete search history.

(56) References Cited

U.S. PATENT DOCUMENTS

| 2004/0251499 A1* | 12/2004 | Yamaguchi | ........... H01L 29/404 |
| | | | 257/343 |
| 2016/0180769 A1* | 6/2016 | Wacyk | ................ H01L 27/3276 |
| | | | 257/40 |

* cited by examiner

*Primary Examiner* — Hoa B Trinh
(74) *Attorney, Agent, or Firm* — ScienBiziP, P.C.

(57) ABSTRACT

An OLED touch display device includes a first electrode layer, a second electrode layer facing the first electrode layer, a light-emitting layer between the first electrode layer and the second electrode, and a third electrode layer on a side of the first electrode layer. The first electrode layer functions as a cathode of the light-emitting layer, and the second electrode layer functions as an anode of the light-emitting layer. The first electrode layer and the third electrode layer cooperatively form a capacitive force sensing element. The first electrode layer also functions as touch sensing electrode.

11 Claims, 7 Drawing Sheets

OLED TOUCH DISPLAY PANEL

FIELD

The subject matter herein generally relates to a touch display panel, particularly to an organic light-emitting diode (OLED) touch display panel.

BACKGROUND

An on-cell or in-cell type touch screen panel can be manufactured by installing a touch panel in a display panel. Such a touch screen panel is used as an output device for displaying images while being used as an input device for receiving a user's touch on a specific area of a displayed image as command. However, the touch screen panel cannot sense the intensity of the touch force.

BRIEF DESCRIPTION OF THE DRAWINGS

Implementations of the present disclosure will now be described, by way of example only, with reference to the attached figures.

DETAILED DESCRIPTION

Figure 1:
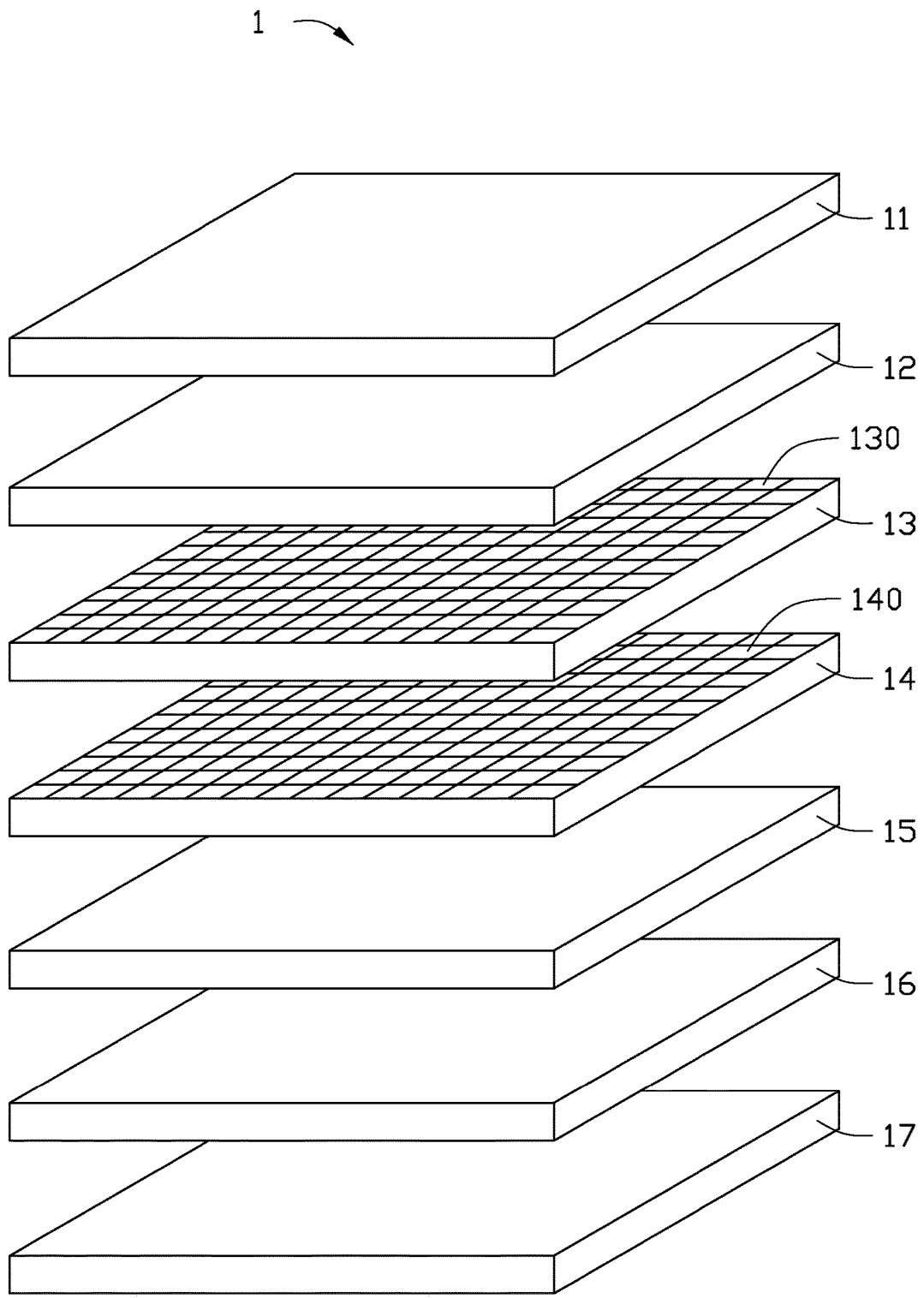
FIG. 1 is an exploded view of a first exemplary embodiment of an OLED touch display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

FIG. 1 illustrates a display panel 1 according to a first exemplary embodiment. The display panel 1 is an OLED display panel. The display panel 1 includes a first substrate 11, a first electrode layer 12, a light-emitting layer 13, a second electrode layer 14, a thin film transistor layer 15, a second substrate 16, and a third electrode layer 17 stacked in that order. The first electrode layer 12 functions as a cathode of the light-emitting layer 13, and the second electrode layer 14 functions as an anode of the light-emitting layer 13. The light-emitting layer 13 may include an electron-injecting layer (not shown), an electron-transporting layer (not shown), an organic light-emitting layer (not shown), a hole-transporting layer (not shown), and a hole-injecting layer (not shown) stacked in that order, wherein the electron-injecting layer is adjacent to the first electrode layer 12; and the hole-injecting layer is adjacent to the second electrode layer 14.

The light-emitting layer 13 is divided into a plurality of light-emitting units 130 spaced apart from each other. The second electrode layer 14 comprises a plurality of pixel electrodes 140 spaced apart from each other. Each light-emitting unit 130 corresponds to and overlaps with one of the pixel electrodes 140. In the present exemplary embodiment, the light-emitting units 130 are arranged in an array; and the pixel electrodes 140 are arranged in an array.

The thin film transistor layer 15 comprises a plurality of thin film transistors (not shown) formed on the second substrate 16. Each thin film transistor may be electrically coupled to one of the pixel electrodes 140 to provide driving current for the pixel electrode 140.

Figure 2:
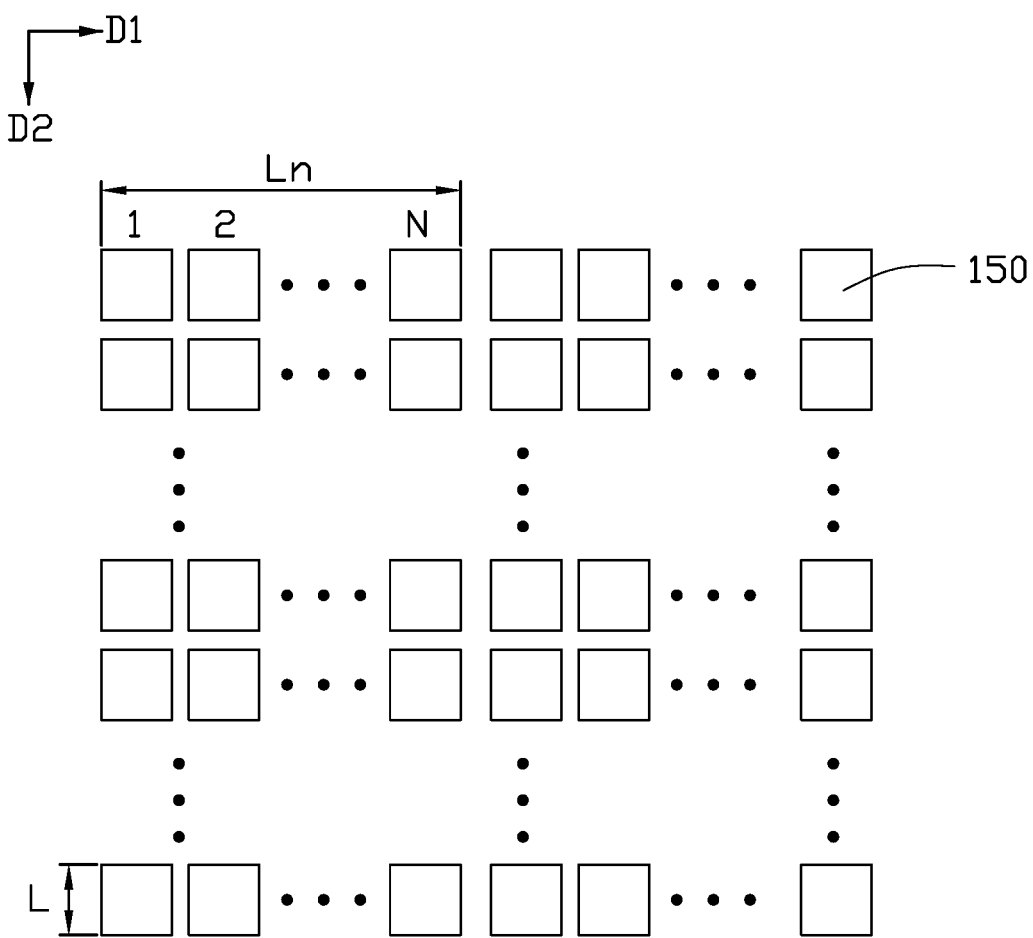
FIG. 2 is a planar view showing a layout of pixel units of the OLED touch display panel of FIG. 1.

The display panel 1 defines a plurality of pixel units 150. As shown in FIG. 2, the pixel units 150 are arranged in a matrix of rows and columns; and each row of the pixel units 150 extends along a first direction D1 and each column of the pixel units 150 extends along a second direction D2. The first direction D1 is perpendicular to the second direction D2. In the present exemplary embodiment, each pixel unit 150 includes three adjacent pixel electrodes 140 and three adjacent light-emitting units 130 corresponding to the three adjacent pixel electrodes 140. The three adjacent light-emitting units 130 in each pixel unit 150 emit red light, green light, and blue light, respectively. In other embodiments, a number of the light-emitting units 130 and a number of the pixel electrodes 140 contained in each pixel unit 150 may be adjusted, not being limited to three. For example, each pixel unit 150 may include four adjacent light-emitting units 130 emitting red light, green light, blue light, and white light, respectively.

Figure 3:
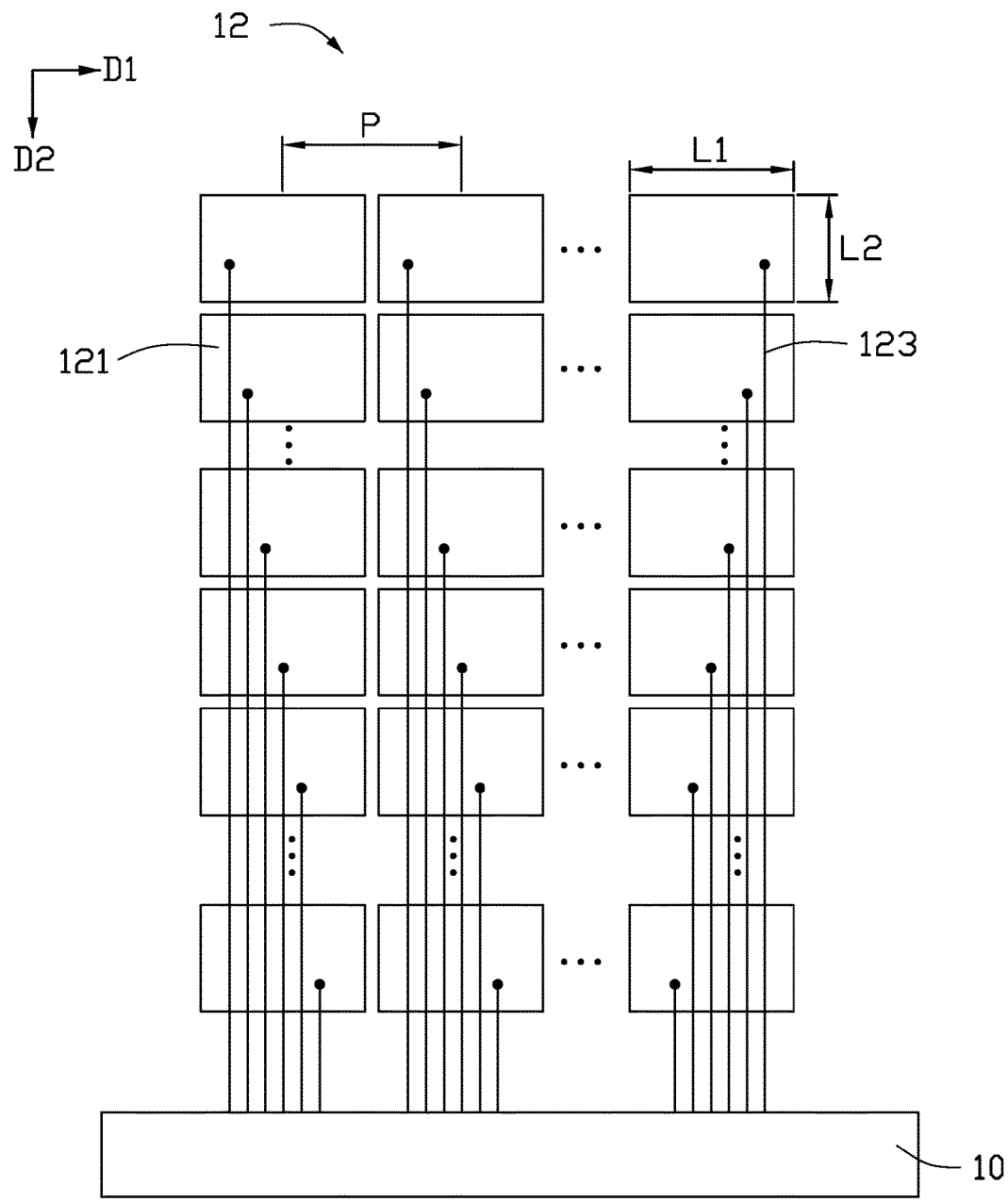
FIG. 3 is a planar view of a first exemplary embodiment of a first electrode layer of the OLED touch display panel of FIG. 1.

As shown in FIG. 3, the first electrode layer 12 includes a plurality of first electrodes 121 spaced apart from each other. The first electrodes 121 functions as a cathode of the light-emitting layer 13, touch sensing electrodes, and force sensing electrodes. The first electrodes 121 may alternatively function as the cathode of the light-emitting layer 13, the touch sensing electrodes, and the force sensing electrodes in a time-division manner. The first electrodes 12 and the third electrode layer 17 cooperatively form a capacitive force sensing structure. The first electrodes 121 may be made of a transparent conductive material, such as indium tin oxide.

The first electrodes 121 are arranged in a matrix of rows and columns. Each row of the first electrodes 121 extends along the first direction D1 and each column of the first electrodes 121 extends along the second direction D2.

The arrangement of the first electrodes 121 as shown in FIG. 3 has a relationship with the arrangement of the pixel units 150 as shown in FIG. 2. Each first electrode 121 corresponds to N adjacent pixel units 150 along the first direction D1, where N is a natural number. A length L1 of each first electrode 121 along the first direction D1 is substantially equal to a total span length Ln spanning N adjacent pixel units 150 along the first direction Dl. A length L2 of each first electrode 121 along the second direction D2 is substantially equal to a length L of one pixel unit 150 along the second direction D2. The value of N depends on the touch resolution of the OLED display device 1, the higher the touch resolution, the greater the distribution concentration of the first electrode 121 and the lower the value of N. The value of N may determine an area of each first electrode 121 and a distance P between the central points of two adjacent first electrodes 121. Where N is greater, the area of each first electrode 121 and the distance P are greater. In the present exemplary embodiment, N is a number in a range from about 40 to about 60.

In the present exemplary embodiment, the display panel 1 uses a single-layer self capacitive touch sensing technique. Each first electrode 121 is electrically coupled to a controlling integrated circuit 10 by a conductive line 123. When a conductor (such as a finger) touches the display panel 1, electrical signals of the first electrodes 121 corresponding to the touch position vary and the electrical signal is outputted to the controlling integrated circuit 10, thus touch position can be detected.

Figure 4:
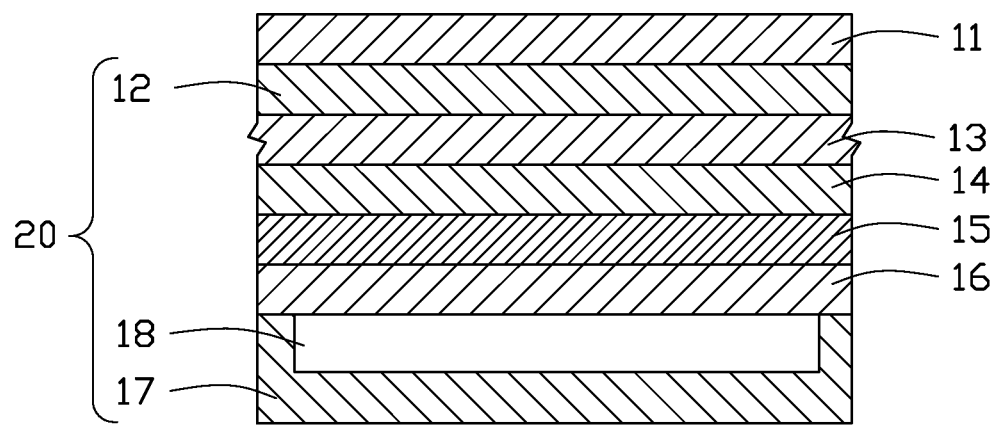
FIG. 4 is a cross-sectional view of a first exemplary embodiment of the OLED touch display panel of FIG. 1.

As shown in FIG. 4, in the present exemplary embodiment, the third electrode layer 17 is a metal frame. An air gap 18 is formed between the third electrode layer 17 and the second substrate 16. The first electrode layer 12, the third electrode layer 17, and the air gap 18 cooperatively form a capacitive force sensing element 20. When a finger touches the display panel 1, the first substrate 11, the first electrode layer 12, the light emitting layer 13, the second electrode layer 14, the thin film transistor layer 15, and the second substrate 16 may be deformed towards the third electrode layer 17. The air gap 18 may be compressed, and a distance between the first electrode layer 12 and the third electrode layer 17 may be reduced, which varies the capacitance between the first electrode layer 12 and the third electrode layer 17. Thus, the force sensing element 20 outputs force sensing signals according to the variation of the capacitance, and the touch force can be detected and calculated.

It is understood that the position of the force sensing element 20 can be modified. In particular, the positions of the first electrode layer 12 and the third electrode layer 17 can be modified.

Figure 5:
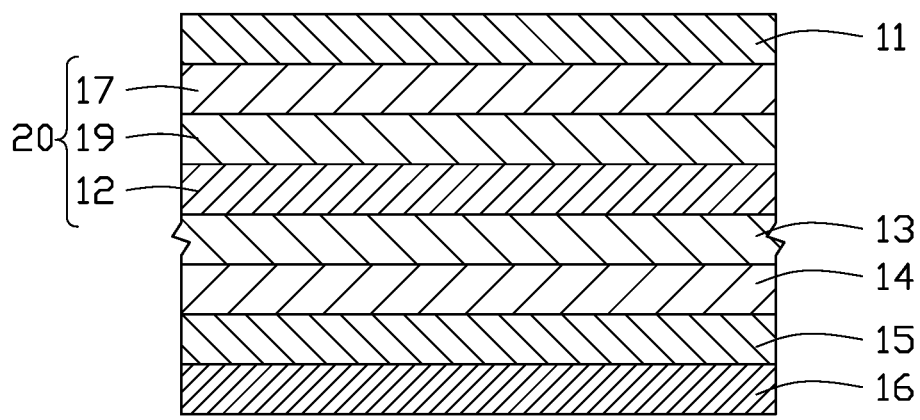
FIG. 5 is a cross-sectional view of a second exemplary embodiment of the OLED touch display panel of FIG. 1.

FIG. 5 illustrates a display panel 2 according to a second exemplary embodiment. The display panel 2 is also an OLED display panel. The display panel 2 includes a first substrate 11, a third electrode layer 17, an insulating layer 19, a first electrode layer 12, a light-emitting layer 13, a second electrode layer 14, a thin film transistor layer 15, and a second substrate 16 stacked in that order. The first substrate 11, the first electrode layer 12, the light-emitting layer 13, the second electrode layer 14, the thin film transistor layer 15, and the second substrate 16 are substantially the same as those of the display panel 1 of the first exemplary embodiment.

The third electrode layer 17 is made of a transparent and conductive material, such as indium tin oxide. The insulating layer 19 is elastic and is between the third electrode layer 17 and the first electrode layer 12. The third electrode layer 17, the insulating layer 19, and the first electrode layer 12 cooperatively form a force sensing element 20 of the display panel 2. When a finger touches the display panel 2, a distance between the first electrode layer 12 and the third electrode layer 17 may be reduced so that a capacitance between the first electrode layer 12 and the third electrode layer 17 may vary. Thus, the force sensing element 20 outputs force sensing signals according to the variation of the capacitance, and the touch force can be detected and calculated.

Figure 6:
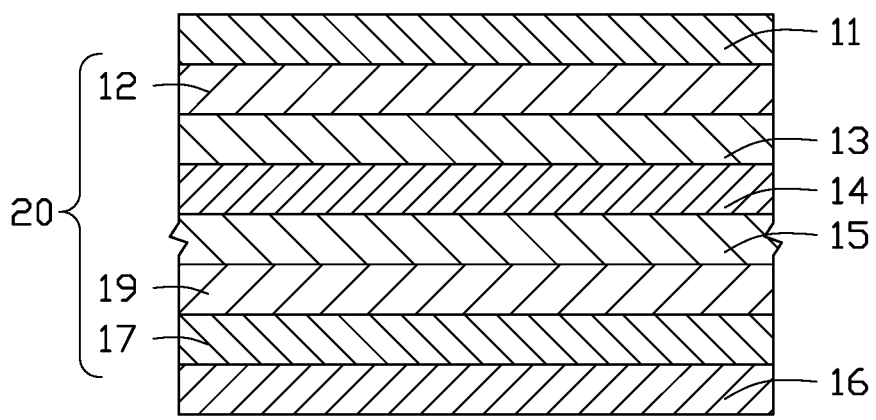
FIG. 6 is a cross-sectional view of a third exemplary embodiment of the OLED touch display panel of FIG. 1.

FIG. 6 illustrates a display panel 3 according to a third exemplary embodiment. The display panel 3 is an OLED display panel. The display panel 3 includes a first substrate 11, a first electrode layer 12, a light-emitting layer 13, a second electrode layer 14, a thin film transistor layer 15, an insulating layer 19, a third electrode layer 17, and a second substrate 16 stacked in that order. The first substrate 11, the first electrode layer 12, the light-emitting layer 13, the second electrode layer 14, the thin film transistor layer 15, and the second substrate 16 are substantially the same as those of the display panel 1 of the first embodiment.

The third electrode layer 17 is made of a conductive material, such as indium tin oxide. The insulating layer 19 is elastic and is between the third electrode layer 17 and the first electrode layer 12. The third electrode layer 17, the insulating layer 19, and the first electrode layer 12 cooperatively form the force sensing element 20 of the display panel 3.

Figure 7:
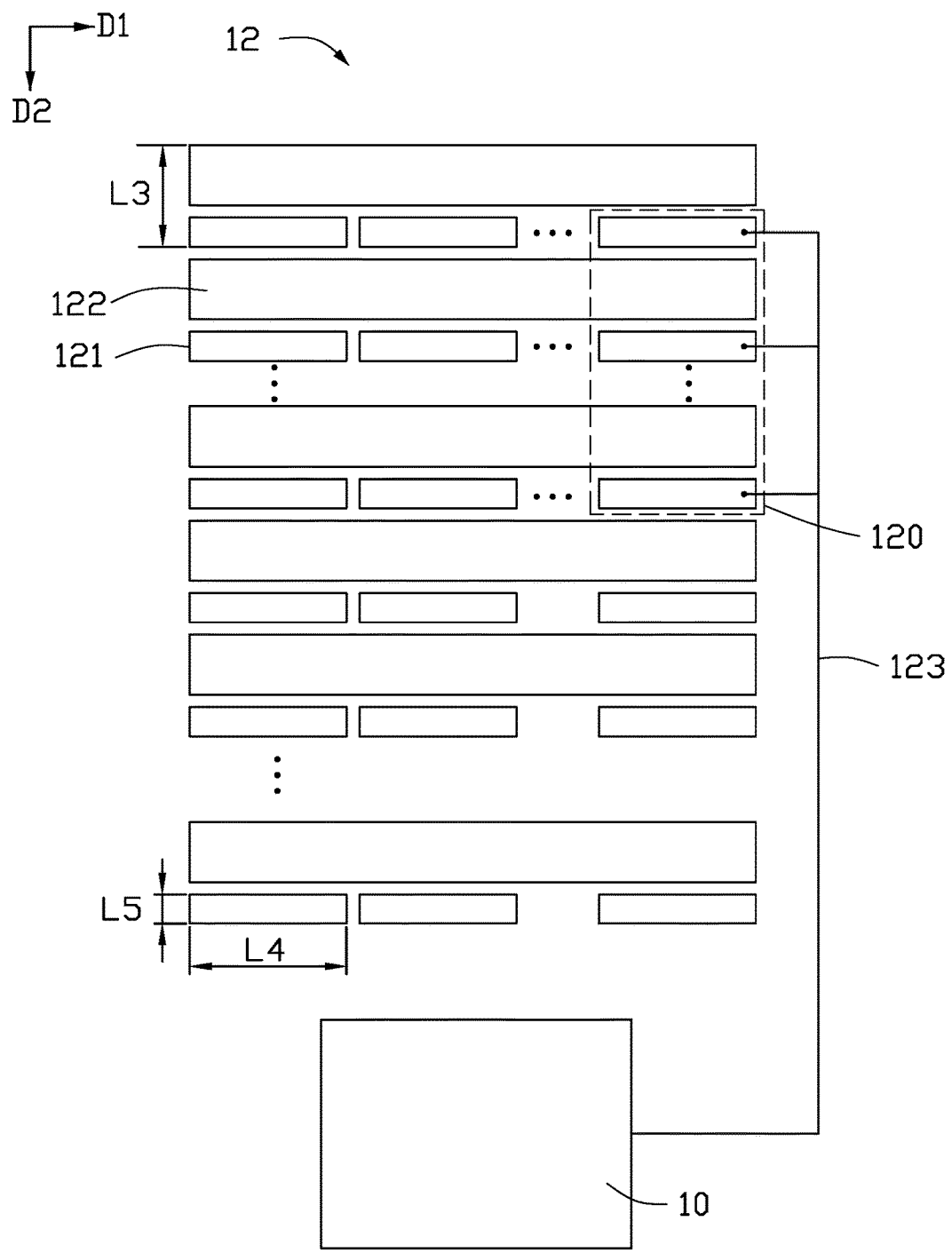
FIG. 7 is a planar view of a second exemplary embodiment of a first electrode layer of the OLED touch display panel of FIG. 1.

FIG. 7 illustrates a first electrode layer 12 according to a modified exemplary embodiment. The first electrode layer 12 of this embodiment is different from the first electrode layer 12 shown in FIG. 2. The first electrode layer 12 includes a plurality of first electrodes 121 spaced apart from each other and a plurality of second electrodes 122 spaced apart from each other. The first electrodes 121 function as touch sensing electrodes and force sensing electrodes, and the second electrodes 122 function as the cathode of the light-emitting layer 13. The first electrodes 121 may alternatively function as touch sensing electrodes and force sensing electrodes, in a time-division manner.

The first electrodes 121 and the second electrodes 122 are formed on a same plane. The first electrodes 121 and the second electrodes 122 may be defined by a same conductive material layer and formed by a single pattern process. The first electrodes 121 and the second electrodes 122 may be made of a same transparent conductive material, such as indium tin oxide.

Each second electrode 122 extends along the first direction D1 in a long strip shape. The plurality of second electrodes 122 is arranged in one column along the second direction D2. A row of the first electrodes 121 is between every two adjacent second electrodes 122. Each row of the first electrodes 121 includes a plurality of first electrodes 121 spaced apart from each other and arranged along the first direction D1. The second electrodes 122 and the first electrodes 121 are alternately arranged along the second direction D2. Each first electrode 121 is electrically insulated from the second electrodes 122.

The arrangement of the first electrodes 121 and the second electrodes 122 as shown in FIG. 7 has a relationship with the arrangement of the pixel units 150 as shown in FIG. 2. Each first electrode 121 corresponds to N adjacent pixel units 150 along the first direction D1, where N is a natural number. A length L4 of each first electrode 121 along the first direction D1 is substantially equal to a total span length Ln spanning N adjacent pixel units 150 along the first direction D1. A total span length L3 spanning one first electrode 121 and one second electrode 122 adjacent to each other along the second direction D2 is substantially equal to of the length L of each pixel unit 150 along the second direction D2. Particularly, a length L5 of one first electrode 121 along the second direction D2 is substantially equal to one third of the length L of each pixel unit 150 along the second direction D2. The value of N depends on the touch resolution of the OLED display device, the higher the touch resolution, the greater the distribution concentration of the first electrode 121 and the less the value of N. The value of N may determine an area of each first electrode 121. Where N is greater, the area of each first electrode 121 is greater. In the present exemplary embodiment, N is a number in a range from about 40 to about 60.

As shown in FIG. 7, in the present exemplary embodiment, several adjacent first electrodes 121 along the second direction D2 are electrically coupled by conductive lines 123 to form a touch sensing electrode 120. Each touch sensing electrode 120 is electrically coupled to a controlling integrated circuit 10 by conductive lines 123.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. An OLED touch display device comprising:
a first electrode layer;
a second electrode layer facing the first electrode layer;
a light-emitting layer between the first electrode layer and the second electrode; and
a third electrode layer on a side of the first electrode layer;
the first electrode layer functioning as a cathode of the light-emitting layer, and the second electrode layer functioning as an anode of the light-emitting layer;
wherein the first electrode layer and the third electrode layer cooperatively form a capacitive force sensing element;
wherein the first electrode layer includes a plurality of first electrodes spaced apart from each other; wherein the plurality of first electrodes are arranged in rows and columns; and wherein each of the rows of the first electrodes extends along a first direction D1 and each of the columns of the first electrodes extends along a second direction D2; wherein the first direction D1 is perpendicular to the second direction;
wherein the first electrode layer further comprises a plurality of second electrodes spaced apart from each other; wherein each of the plurality of first electrodes are electrically insulated from the plurality of second electrodes; wherein the plurality of first electrodes function as touch sensing electrodes and force sensing electrodes by a time-division manner, and the plurality of second electrodes function as the cathode of the light-emitting layer;
wherein each of the plurality of second electrodes extends along the first direction D1 to be a strip; wherein the plurality of second electrodes are arranged in one column along the second direction; wherein one of the rows of the first electrodes is between every two adjacent of the plurality of second electrodes.

2. The OLED touch display device of claim 1, wherein the light-emitting layer comprises a plurality of light-emitting units spaced apart from each other; wherein the second electrode layer comprises a plurality of pixel electrodes spaced apart from each other; wherein each of the plurality of light-emitting units corresponds to one of the plurality of pixel electrodes; wherein the OLED touch display panel defines a plurality of pixel units arranged in rows and columns; wherein each of the plurality of pixel units comprises at least one of the plurality of pixel electrodes and at least one of the plurality of light-emitting units corresponding to the at least one of the plurality of pixel electrodes.

3. The OLED touch display device of claim 2, wherein each of the plurality of first electrodes corresponds to N adjacent pixel units along the first direction D1, wherein N is a natural number; wherein a length L4 of each of the plurality of first electrodes along the first direction D1 is equal to a total span length Ln spanning N adjacent pixel units along the first direction Dl; and wherein a total span length L3 spanning one of the plurality of first electrodes and one of the plurality of second electrodes adjacent to each other along the second direction D2 is equal to a length L of each of the plurality of pixel units along the second direction D2.

4. The OLED touch display device of claim 3, wherein a length L5 of one of the plurality of first electrodes along the second direction D2 is equal to one third of the length L of each of the plurality of pixel units along the second direction D2.

5. The OLED touch display device of claim 1, wherein the third electrode layer is a metal frame and is on a side of the second electrode layer away from the first electrode layer; wherein an air gap is formed between the third electrode layer and the electrode layer; wherein the first electrode layer, the third electrode layer, and the air gap cooperatively form a capacitive force sensing element of the OLED touch display panel.

6. The OLED touch display device of claim 1, further comprising an insulating layer, wherein the third electrode layer is on a side of the first electrode layer away from the second electrode layer; wherein the insulating layer is elastic and between the third electrode layer and the first electrode layer; wherein the third electrode layer, the insulating layer, and the first electrode layer cooperatively form a force sensing element of the OLED touch display panel.

7. The OLED touch display device of claim 1 further comprising an insulating layer, wherein the third electrode layer is on a side of the second electrode layer away from the first electrode layer; wherein the insulating layer is elastic and between the third electrode layer and the second electrode layer; wherein the third electrode layer, the insulating layer, and the first electrode layer cooperatively form a force sensing element of the OLED touch display panel.

8. An OLED touch display device comprising:
a first electrode layer;
a second electrode layer facing the first electrode layer;
a light-emitting layer between the first electrode layer and the second electrode; and
a third electrode layer;
the first electrode layer functioning as a cathode of the light-emitting layer, and the second electrode layer functioning as an anode of the light-emitting layer;
wherein the first electrode layer functions as touch sensing electrode;
wherein the third electrode layer is a metal frame and is on a side of the second electrode layer away from the first electrode layer; wherein an air gap is formed between the third electrode layer and the electrode layer; wherein the first electrode layer, the third electrode layer, and the air gap cooperatively form a capacitive force sensing element of the OLED touch display panel.

9. An OLED touch display device comprising:
a first electrode layer;
a second electrode layer facing the first electrode layer; and
a light-emitting layer between the first electrode layer and the second electrode;
the first electrode layer functioning as a cathode of the light-emitting layer, and the second electrode layer functioning as an anode of the light-emitting layer;
wherein the first electrode layer includes a plurality of first electrodes spaced apart from each other; wherein the plurality of first electrodes are arranged in rows and columns; and wherein each of the rows of the first electrodes extends along a first direction D1 and each of the columns of the first electrodes extends along a second direction D2; wherein the first direction D1 is perpendicular to the second direction; the plurality of first electrodes function as cathode of the light-emitting layer, touch sensing electrodes, and force sensing electrodes by a time-division manner;
wherein the light-emitting layer comprises a plurality of light-emitting units spaced apart from each other; wherein the second electrode layer comprises a plurality of pixel electrodes spaced apart from each other; wherein each of the plurality of light-emitting units corresponds to one of the plurality of pixel electrodes; wherein the OLED touch display panel defines a plurality of pixel units arranged in rows and columns; wherein each of the plurality of pixel units comprises at least one of the plurality of pixel electrodes and at least one of the plurality of light-emitting units corresponding to the at least one of the plurality of pixel electrodes;
wherein each of the rows of the pixel units extends along the first direction D1 and each of the columns of the pixel units extends along the second direction D2;
wherein each of the plurality of first electrodes corresponds to N adjacent pixel units along the first direction D1, wherein N is a natural number;
wherein a length L1 of each of the plurality of first electrodes along the first direction D1 is equal to a total span length Ln spanning N adjacent pixel units along the first direction D1; wherein and a length L2 of each of the plurality of first electrodes along the second direction D1 is equal to a length L of each of the plurality of pixel units along the second direction D2.

10. The OLED touch display device of claim 9, wherein N is a number in a range from about 40 to about 60.

11. The OLED touch display device of claim 9, further comprising a third electrode layer, wherein the third electrode layer is a metal frame and is on a side of the second electrode layer away from the first electrode layer; wherein an air gap is formed between the third electrode layer and the electrode layer; wherein the first electrode layer, the third electrode layer, and the air gap cooperatively form a capacitive force sensing element of the OLED touch display panel.

* * * * *